United States Patent
Jung et al.

(10) Patent No.: US 8,547,105 B2
(45) Date of Patent: Oct. 1, 2013

(54) SYSTEM AND METHOD FOR DETECTING A LOCATION OF FAULT IN A CABLE

(75) Inventors: Chae-Kyun Jung, Daejeon (KR); Ji-Won Kang, Daejeon (KR)

(73) Assignee: Korea Electric Power Corporation, Seoul (KR)

( * ) Notice: Subject to any disclaimer, the term of this patent is extended or adjusted under 35 U.S.C. 154(b) by 401 days.

(21) Appl. No.: 12/886,815

(22) Filed: Sep. 21, 2010

(65) Prior Publication Data

US 2011/0074437 A1   Mar. 31, 2011

(30) Foreign Application Priority Data

Sep. 30, 2009   (KR) .................. 10-2009-0093331
May 17, 2010   (KR) .................. 10-2010-0045961

(51) Int. Cl.
*G01R 31/08*   (2006.01)
(52) U.S. Cl.
USPC .......................... 324/527; 324/543

(58) Field of Classification Search
USPC ............................ 324/539–544, 527
See application file for complete search history.

(56) References Cited

U.S. PATENT DOCUMENTS 6,703,842 B2 * 3/2004 Itimura et al. .............. 324/544
2004/0189317 A1 * 9/2004 Borchert et al. ............ 324/512

* cited by examiner

*Primary Examiner* — Vincent Q Nguyen
(74) *Attorney, Agent, or Firm* — McDermott Will & Emery LLP

(57) ABSTRACT

A system for detecting a location of fault in a cable includes a cable transmitting a fault current a current transforming unit connected to the cable and receiving the fault current and detecting an original signal of fault current, a detecting unit detecting a first detail signal and a second detail signal from the original signal of fault current where both signals being detail components in a high frequency band, a comparing unit comparing the first detail signal with a preset reference value and determining a fault in the cable, and a signal filtering unit generating a first filtering signal and a second filtering signal by use of the first detail signal and the second detail signal and outputting a fault detection signal based on a result of comparing the both signals.

20 Claims, 4 Drawing Sheets

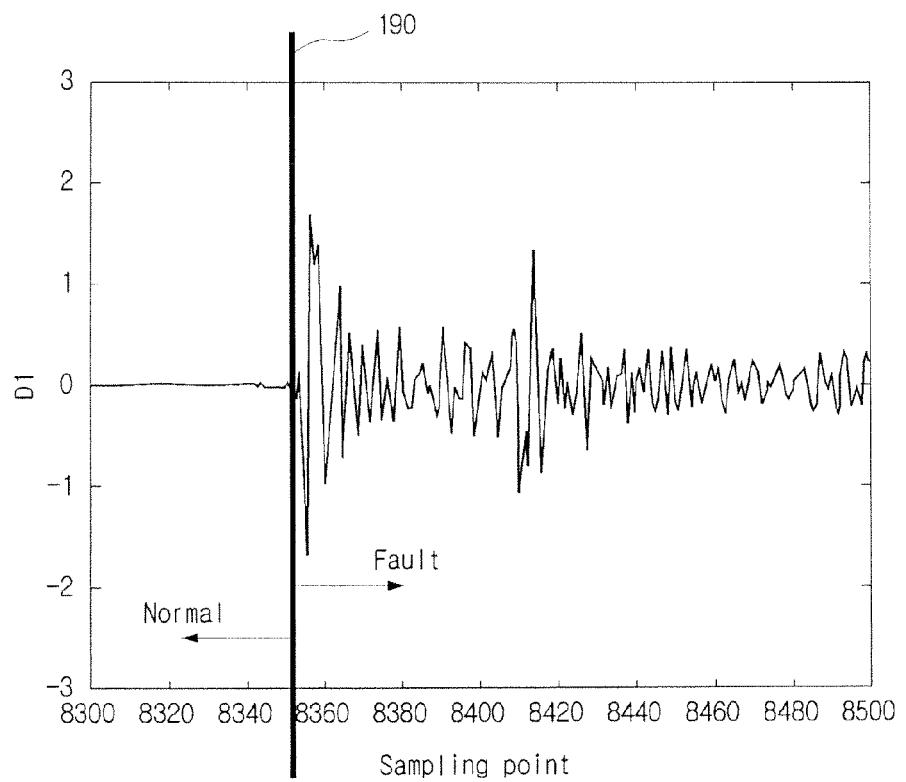

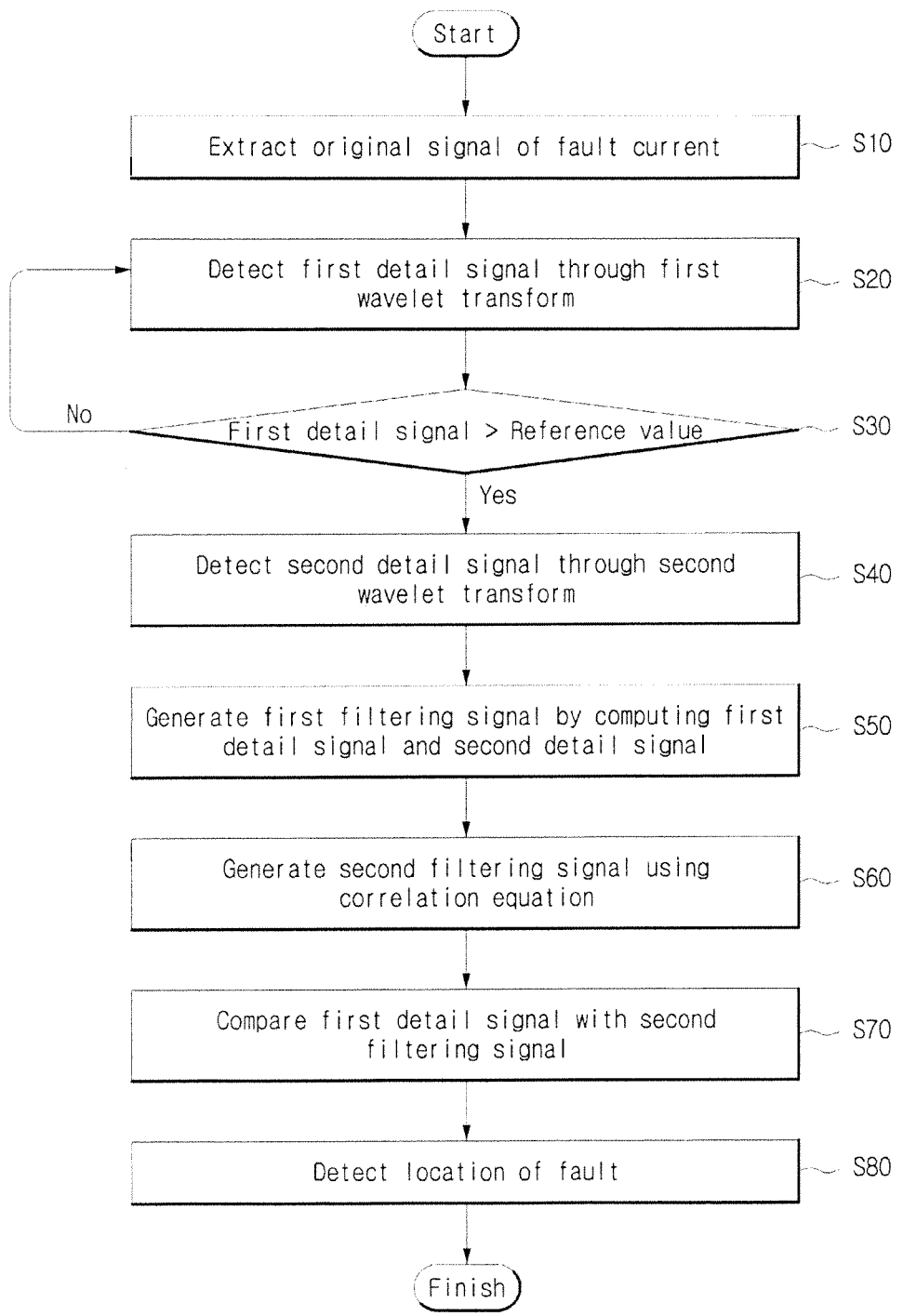

SYSTEM AND METHOD FOR DETECTING A LOCATION OF FAULT IN A CABLE

CROSS-REFERENCE TO RELATED APPLICATIONS

This application claims the benefit of Korean Patent Application Nos. 10-2009-0093331 and 10-2010-0045961, filed with the Korean Intellectual Property Office on Sep. 30, 2009 and May 17, 2010, respectively, the disclosure of which is incorporated herein by reference in their entirety.

BACKGROUND

1. Technical Field

The present invention is related to a system and a method for detecting a location of fault in a cable.

2. Description of the Related Art

In order to detect the location of fault in an underground cable used for extra high voltage transmission, various methods, such as the Murray loop method using Wheatstone bridge principles, a method using TDR (Time Domain Reflectometer) based on the principle of progressive wave and the pin pointing method, are used. These methods are applied in an off-line environment to detect the location of fault in an underground cable. When fault occurs, the relevant line needs to be completely separated from the system for the detection of the location of fault, thereby taking a great amount of time to detect the location of fault and to repair the fault.

SUMMARY

The present invention provides a system for detecting a location of fault in a cable that can perform an on-line detection of the location of fault.

The present invention also provides a method of detecting a location of fault in a cable that can perform an on-line detection of the location of fault using the system for detecting a location of fault in a cable.

An aspect of the present invention features a system for detecting a location of fault in a cable.

The system for detecting a location of fault in a cable in accordance with an embodiment of the present invention can include: a cable, transmitting a fault current; a current transforming unit, connected to the cable and receiving the fault current and detecting an original signal of fault current; a detecting unit, detecting a first detail signal and a second detail signal from the original signal of fault current, the first detail signal and second detail signal being detail components in a high frequency band; a comparing unit, comparing the first detail signal with a preset reference value and determining a fault in the cable; and a signal filtering unit, generating a first filtering signal and a second filtering signal by use of the first detail signal and the second detail signal and outputting a fault detection signal based on a result of comparing the first detail signal with the second filtering signal.

Another aspect of the present invention features a method of detecting a location of fault in a cable.

The method of detecting a location of fault in a cable in accordance with an embodiment of the present invention can include: extracting an original signal of fault current at either end of the cable; detecting a first approximation signal and a first detail signal from the original signal of fault current through wavelet transform; determining whether or not a fault is occurred in the cable by comparing the first detail signal with a preset reference value; detecting a second approximation signal and a second detail signal from the first approximation signal through wavelet transform; generating a first filtering signal by computing the first detail signal and the second detail signal; generating a second filtering signal with a correlation equation that is set by using the first detail signal and the first filtering signal; and outputting a fault detection signal by comparing the first detail signal with the second filtering signal.

Yet another aspect of the present invention features a recording medium having recorded a program for realizing a method of detecting a location of fault in a cable.

The recording medium having recorded the program for realizing the method of detecting a location of fault in a cable in accordance with an embodiment of the present invention can be read by an electronic device, and the method of detecting a location of fault in a cable can include: extracting an original signal of fault current at either end of the cable; detecting a first approximation signal and a first detail signal from the original signal of fault current through wavelet transform; determining whether or not a fault is occurred in the cable by comparing the first detail signal with a preset reference value; detecting a second approximation signal and a second detail signal from the first approximation signal through wavelet transform; generating a first filtering signal by computing the first detail signal and the second detail signal; generating a second filtering signal with a correlation equation that is set by using the first detail signal and the first filtering signal; and outputting a fault detection signal by comparing the first detail signal with the second filtering signal.

BRIEF DESCRIPTION OF THE DRAWINGS

FIG. 3 is a graph for illustrating a reference value that is set in a comparing unit in accordance with an embodiment of the present invention.

FIG. 4 illustrates a method of detecting a location of fault in a cable in accordance with an embodiment of the present invention.

DETAILED DESCRIPTION

Figure 1:
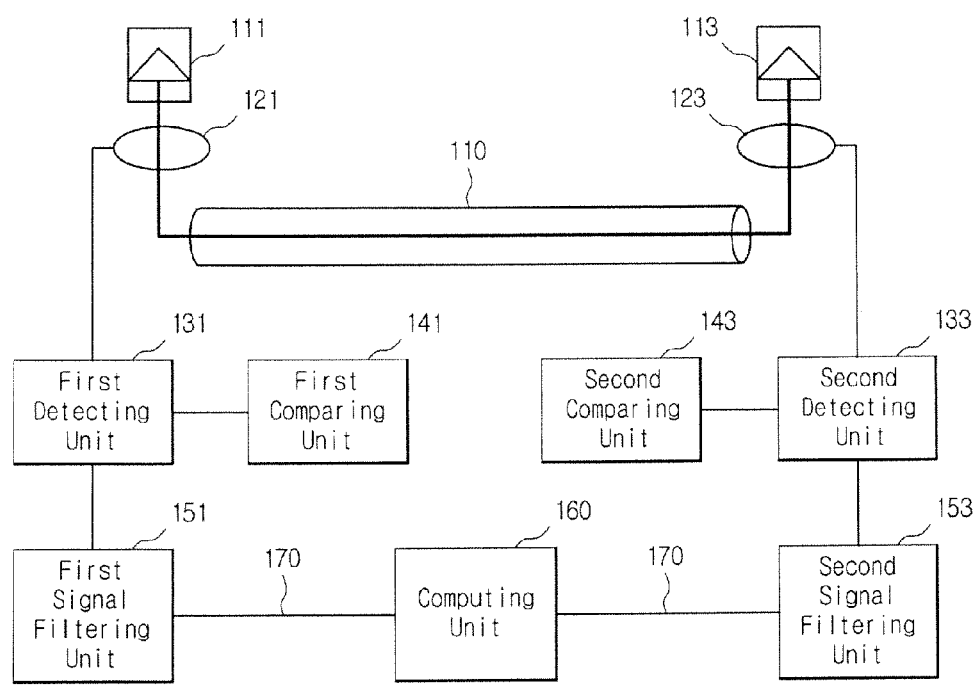
FIG. 1 illustrates a system for detecting a location of fault in a cable in accordance with an embodiment of the present invention.

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the ideas and scope of the present invention.

Terms such as "first" and "second" can be used in describing various elements, but the above elements shall not be restricted to the above terms. The above terms are used only to distinguish one element from the other. For instance, the first element can be named the second element, and vice versa, without departing the scope of claims of the present invention. The term "and/or" shall include the combination of a plurality of listed items or any of the plurality of listed items.

When one element is described as being "connected" or "accessed" to another element, it shall be construed as being connected or accessed to the other element directly but also as possibly having another element in between. On the other hand, if one element is described as being "directly connected" or "directly accessed" to another element, it shall be construed that there is no other element in between.

Hereinafter, some embodiments of the present invention will be described in detail with reference to the accompanying drawings. Identical or corresponding elements will be given the same reference numerals, regardless of the figure number, and any redundant description of the identical or corresponding elements will not be repeated. Throughout the description of the present invention, when describing a certain technology is determined to evade the point of the present invention, the pertinent detailed description will be omitted.

FIG. 1 is a diagram illustrating a system for detecting a location of fault in a cable in accordance with an embodiment of the present invention.

Referring to FIG. 1, a system for detecting a location of fault in a cable 100 includes a cable 110, first and second current transforming units 121, 123, first and second detecting units 131, 133, first and second comparing units 141, 143, first and second signal filtering units 151, 153 and a computing unit 160.

The cable 110 transmits an electrical current.

The first and second current transforming units 121, 123 are arranged by being connected to either end of the cable 110. The first and second current transforming units 121, 123 are located at end parts of the cable 110 to receive a fault current from the cable 110. The first and second current transforming units 121, 123 detect an original signal of fault current from the fault current. The first and second current transforming units 121, 123 provide the detected original signal of fault current to the first and second detecting units 131, 133.

The first and second detecting units 131, 133 receive the original signal of fault current. The first and second detecting units 131, 133 apply wavelet transform to the original signal of fault current. After the application of the wavelet transform, the first and second detecting units 131, 133 detect a first approximation signal, which is in a low frequency band, and a first detail signal, which is in a high frequency band, from the original signal of fault current. The first and second detecting units 131, 133 provide the first detail signal to the first and second comparing units 141, 143.

In an example, the first and second detecting units 131, 133 can apply the wavelet transform to the original signal of fault current by use of MATLAB by The MathWorks, Inc.

Here, the wavelet transform is a part of analytics that is used in relations to signal processing, video processing, etc. The wavelet transform is appropriate for detecting the location of fault because analysis of an excessive signal is possible not only in a frequency band but also in a time domain. The wavelet transform sets the waveform of a wavelength as its basic waveform and verifies a correlation by changing its size and location. The wavelet transform changes the size in a similar concept as the frequency change of Fourier series. Since the wavelet transform changes the location of the waveform of a wavelength together with the size, it is possible to find time information. For example, since the wavelet transform shows variable window characteristics in a time-scale domain, high-frequency components are shown in a low scale, and low-frequency components are shown in a high scale.

Hereinafter, the wavelet transform of the first and second detecting units 131, 133 will be described with reference to FIG. 2, which illustrates wavelet conversion of a detecting unit in accordance with an embodiment of the present invention. Here, for the convenience of description, the first detecting unit 131 will be used for the description.

Figure 2:
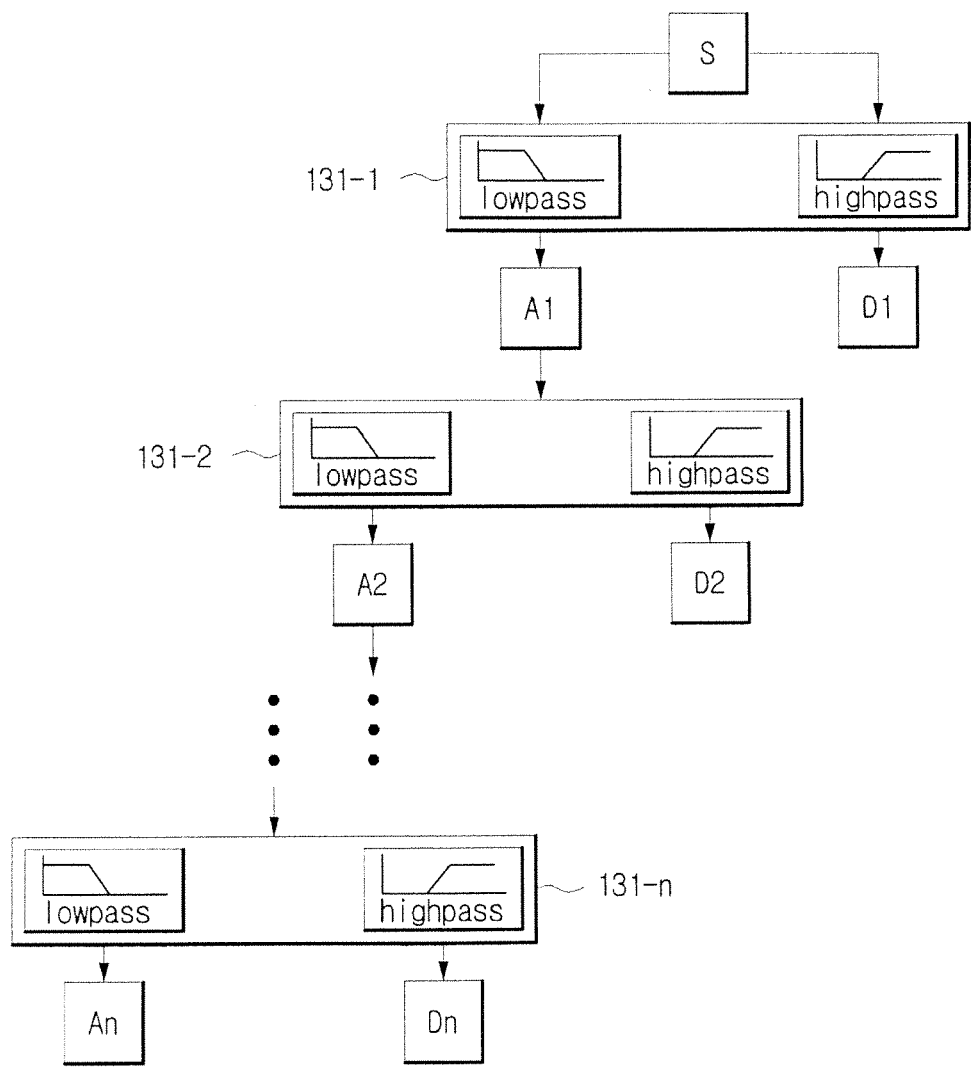
FIG. 2 illustrates wavelet conversion of a detecting unit in accordance with an embodiment of the present invention.

Referring to FIG. 2 further, the first detecting unit 131 includes first to $n^{th}$ wavelet filtering units 131-1, 131-2, . . . , 131-n. The first wavelet filtering unit 131-1 allows an original signal of fault current, which is represented as "S" in FIG. 2, to pass through a low pass filter and a high pass filter to extract a first approximation signal, which is represented as "A1" in FIG. 2, in a low frequency band and a first detail signal, which is represented as "D1" in FIG. 2, in a high frequency band from the original signal of fault current S. The second wavelet filtering unit 131-2 extracts a second approximation signal A2 in a low frequency band and a second detail signal D2 in a high frequency band from the first approximation signal A1. The first detecting unit 131 continues the extracting steps using the first to $n^{th}$ wavelet filtering units 131-1, 131-2, . . . , 131-n until a desired signal is obtained from the original signal of fault current S.

Referring to FIG. 1 again, the first and second comparing units 141, 143 receive the first detail signal from the first and second detecting units 131, 133. The first and second comparing units 141, 143 compare the first detail signal with a preset reference value. Here, the reference value is set as a reference for determining a fault in the cable 110. A fault in the cable 110 can have different characteristics depending on the state, load conditions or fault resistance of the cable 110. Accordingly, the reference value can be set variously according to the state or conditions of the cable 110.

Here, the reference value will be described further with reference to FIG. 3.

FIG. 3 is a graph for illustrating a reference value that is set in a comparing unit in accordance with an embodiment of the present invention.

Referring to FIG. 3 further, the first and second comparing units 141, 143 compare the first detail signal with a reference value 190 set according to the state or conditions of the cable 110. In an example, the reference value 190 can be set as a sampling point of 8350.

The first and second comparing units 141, 143 determine that the cable 110 is in a fault state if the first detail signal exceeds the reference value 190. The first and second comparing units 141, 143 determine that the cable 110 is in a normal state if the first detail signal is below or equal to the reference value 190. If the first detail signal exceeds the reference value 190, the first and second comparing units 141, 143 notify the first and second detecting units 131, 133 of the occurrence of fault.

Referring to FIG. 1 again, the first and second detecting units 131, 133 apply the wavelet transform to the first approximation signal if a fault is occurred in the cable 110. The first and second detecting units 131, 133 detect the second approximation signal and the second detail signal from the first approximation signal. Since this has been described above with reference to FIG. 2, detailed description will be omitted. The first and second detecting units 131, 133 provide the first detail signal or the second detail signal to the first and second signal filtering units 151, 153.

The first and second signal filtering units 151, 153 receive the first detail signal and the second detail signal from the first and second detecting units 131, 133. The first and second signal filtering units 151, 153 make a computation in accordance with a correlation of the first detail signal and the second detail signal.

Specifically, the first and second signal filtering units 151, 153 generate a first filtering signal using a multi-scale correlation method based on the correlation of the first detail signal and the second detail signal. For example, the first and second signal filtering units 151, 153 generate the first filtering signal by multiplying the first detail signal by the second detail signal.

In addition, the first and second signal filtering units 151, 153 generate a second filtering signal by computing the first detail signal and the first filtering signal.

The second filtering signal can be generated by the following correlation equation.

$$C\_new = C \times \sqrt{\frac{\sum D_1^2}{\sum C^2} \times 2} \qquad \text{[Equation 1]}$$

Here, C is the first filtering signal, C_new is the second filtering signal, and $D_1$ is the first detail signal.

The correlation equation is set to multiply a correlation coefficient, which uses a summed value obtained by squaring a value of the first detail signal and a summed value obtained by squaring a value of the first filtering signal, by the first filtering signal.

As the second detail signal is applied with the wavelet transform, noise included in a signal exceeding the first detail signal is reduced. At the same time, in the second detail signal, a reflected wave, which has a more regular pattern in proportion to the length of the cable 110 than an irregularly occurred noise does, shows a peak in the same time domain. In other words, the number of maxima in which noise is included is gradually reduced as the scale increases. Therefore, multiplying the first detail signal by the second detail signal further increases the difference between the peak value and the noise.

Here, in order to detect a more complete correlation signal from the first filtering signal, the second filtering signal is generated by multiplying the first filtering signal by the coefficient of $$\sqrt{\frac{\sum D_1^2}{\sum C^2} \times 2}.$$

Since the first filtering signal, which is generated by multiplying the first detail signal by the second detail signal, becomes bigger than the first detail signal, the first detail signal is doubled, and then the second filtering signal is generated by taking a coefficient that is a square root of the sum of squares of the first detail signal divided by the sum of squares of the first filtering signal. For example, in order to reflect each of the first detail signal and the first filtering signal in the coefficient in Equation 1, the squares of each signal are summed and applied in Equation 1. The sum of the squares of the first detail signal and the sum of the squares of the first filtering signal are configured to include a number of signal components in order to reflect the signal components of each of the first detail signal and the first filtering signal.

The first and second signal filtering units 151, 153 compare an absolute value of the first detail signal with an absolute value of the second detail filtering signal. Here, the second filtering signal can have a greater absolute value than the first detail signal, in case a fault occurs in the cable 110. The second filtering signal is greater than the first detail signal because the fault current detected when the fault current is reflected at a first end part 111 and a second end part 113 has an increased noise when the fault occurs.

Alternatively, the second filtering signal can have a smaller absolute value than the first detail signal because the noise component of the second filtering signal is reduced when the scale is increased.

If the absolute value of the second filtering signal is greater than the absolute value of the first detail signal, the first and second signal filtering units 151, 153 determine that the second filtering signal is a reflected wave reflected by the cable 110, after which the first and second signal filtering units 151, 153 output the second filtering signal as a fault detection signal.

If the absolute value of the second filtering signal is smaller than or equal to the first detail signal, the first and second signal filtering units 151, 153 determine that the second filtering signal is a noise and remove the second filtering signal. After the removal, the first and second signal filtering units 151, 153 output the first detail signal as the fault detection signal.

If the value obtained by multiplying the first filtering signal by the coefficient is greater than the first detail signal, the first and second signal filtering units 151, 153 determine that the second filtering signal is a reflected wave, output the first filtering signal as the fault detection signal, and treat and remove other signals as noise.

The computing unit 160 is connected with the first and second signal filtering units 151, 153 to receive the fault detection signal. Here, the computing unit 160 is connected with the first and second signal filtering units 151, 153 by use of a data communication device 170. For example, the computing unit 160 computes a delay time of the fault detection signal by using the data communication device 170 that utilizes a communication line including an optical cable or a GPS apparatus.

The computing unit 160 computes the distance to a location of fault by use of the delay time of the fault detection signal and the transmission speed of the cable 110. The computing unit 160 computes the distance to the location of fault by using the following equation.

$$X = \frac{L + v \cdot (TA_{p1} - TB_{p1})}{2} \qquad \text{[Equation 2]}$$

Here, "X" is the distance to the location of fault, and "L" is a distance between both ends of the cable, while "v" is the transmission speed of the cable, "$TA_{P1}$" a first arrival time of a first signal arriving at the first end part 111, "$TB_{P1}$" a second arrival time of a first signal arriving at the second end part 113.

The computing unit 160 receives the delay time, which is the difference in arrival time of progressive waves, each of which arrives at the first end part 111 and the second end part 113. The computing unit 160 multiplies the delay time by the transmission speed of the cable 110 and then adds the distance between both ends of the cable 110 to the multiplied value before dividing into two.

For example, if it is assumed that a fault has occurred at a location that is 20 km away from one end of the cable 110, the first detail signal, from which noise is removed through the first and second signal filtering units 151, 153, arrives at either end of the cable 110 in the first arrival time of $TA_{p1}$ and the second arrival time of $TB_{p1}$, respectively. Here, if it is set that the distance L between both ends of the cable 110 is 101.7 km, the transmission speed v of the cable 110 is approximately 137.2 m/μs, the first arrival time $TA_{p1}$ is 0.008475, and the second arrival time $TB_{p1}$ is 0.008924, the computing unit 160 can compute that the distance to the location of fault is approximately 20.24 km.

The system for detecting a location of fault in a cable in accordance with an embodiment of the present invention detects the location of fault in the cable by generating the first filtering signal using the first detail signal and the second detail signal that are obtained through wavelet transform, removing the noise by comparing the first detail signal with the second filtering signal that is generated using the first filtering signal and the first detail signal, and outputting the signal determined to be the reflected wave. Accordingly, the system for detecting a location of fault in a cable in accordance with an embodiment of the present invention can make an on-line detection of the fault location in the cable.

In the system for detecting a location of fault in a cable in accordance with an embodiment of the present invention, the signal filters can effectively remove a great amount of noise included in the original signal of fault current and detect the signals reflected by the cable only, thereby reducing the effect of rapid signal attenuation. Therefore, the system for detecting a location of fault in a cable in accordance with an embodiment of the present invention can detect the location of fault accurately.

FIG. 4 illustrates a method of detecting a location of fault in a cable in accordance with an embodiment of the present invention. Hereinafter, the method of detecting a location of fault in a cable will be described with reference to the system for detecting a location of fault in a cable illustrated in FIG. 1.

Referring to FIG. 4, the method of detecting a location of fault in a cable in accordance with an embodiment of the present invention includes: extracting an original signal of fault current (S10); detecting a first detail signal (S20); comparing the first detail signal with a reference value (S30); detecting a second filtering signal (S40); generating a first filtering signal (S50); generating a second filtering signal (S60); detecting a fault detection signal by comparing the first detail signal with the second filtering signal (S70); and detecting the location of fault (S80).

In the step of S10, current transforming units are arranged at either end of a current-transmitting cable and extract an original signal of fault current. Here, the current transforming units receive the fault current from the cable and extract the original signal of fault current through data sampling.

In the step of S20, detecting units apply wavelet transform to the original signal of fault current and detect a first approximation signal, which is in a low frequency band, and a first detail signal, which is in a high frequency band.

In the step of S30, comparing units receive the first detail signal from the detecting units and compare the first detail signal with a preset reference value. Here, the reference value is set as a reference for determining a fault in the cable. Since the fault in the cable can have different characteristics depending on the state, load conditions or fault resistance of the cable, the reference value can be set variously according to the state or conditions of the cable.

The comparing units compare the first detail signal with the reference value to determine whether or not there is a fault in the cable. The comparing units determine that there is no fault occurred in the cable if the first detail signal is below or equal to the reference value. If the first detail signal exceeds the reference value, the comparing units determine that a fault is occurred in the cable.

In the step of S40, the detecting units apply the wavelet transform to the first approximation signal if a fault is determined to have occurred in the cable according to the result of comparison by the comparing units, and detect a second approximation signal and a second detail signal. Here, the second approximation signal is an approximation component in a low frequency band that is detected from the first approximation signal. The second detail signal is a detail component in a high frequency band that is detected from the first approximation signal.

In the step of S50, signal filtering units receive the first detail signal and the second detail signal from the detecting units. The signal filtering units generate a first filtering signal by computing the first detail signal and the second detail signal in accordance with a correlation. For example, the signal filtering units generates the first filtering signal by multiplying the first detail signal by the second detail signal.

In the step of S60, the signal filtering units generate a second filtering signal use of a correlation equation. Here, the correlation equation is set to multiply a correlation coefficient, which uses a summed value obtained by squaring a value of the first detail signal and a summed value obtained by squaring a value of the first filtering signal, by the first filtering signal.

In the step of S70, the signal filtering units compare the first detail signal with the second filtering signal. Specifically, the signal filtering units compare an absolute value of the first detail signal with an absolute value of the second filtering signal to detect a fault detection signal. If the absolute value of the second filtering signal is greater than the absolute value of the first detail signal, the signal filtering units determine that the second filtering signal is a reflected wave signal reflected by both ends of the cable and detect the second filtering signal as a fault detection signal. If the absolute value of the second filtering signal is smaller than or equal to the first detail signal, the signal filtering units determine that the second filtering signal is a noise and remove the second filtering signal. Then, the signal filtering units detect the first detail signal as the fault detection signal. The fault detection signal is a signal that allows detection of time at which a fault signal is reflected in a main line of the cable after the fault signal travels to either end of the main line when a fault occurs. The signal filtering units output the fault detection signal to a computing unit.

In the step of S80, the computing unit detects the fault detection signal at either end of the cable. Then, the computing unit computes a delay time of the detected fault detection signal by use of a data communication device. Then, the computing unit computes the distance to the location of fault by using the delay time of the fault detection signal and a transmission speed of the cable.

The method of detecting a location of fault in a cable in accordance with an embodiment of the present invention makes an on-line detection of the location of fault by using a progressive wave and computes the location of fault by using the fault signal detected in the main line at either end of the cable. Since it only requires that the first signal arriving in the main line at either end of the cable is detected, the method of detecting a location of fault in a cable in accordance with an embodiment of the present invention is not affected by the reduction occurred in later-arriving signals. Therefore, unlike an off-line method of detection a location of fault, the on-line detection of the location of fault can be made as soon as the fault occurs, enabling a rapid detection of the fault location and minimizing the time and cost required for repair.

The embodiment of the present invention can include a computer-readable medium that includes program commands for executing operations realized in various computers. The computer-readable medium can include program commands, local data files and local data structures individually or in combination. The medium can be specially designed and constructed for the present invention or can be known and usable by anyone skilled in computer software.

Hitherto, the present invention has been described with reference to some embodiment. There can be many other embodiments in addition to the described embodiment within the claims of the present invention. It shall be understood by a person of ordinary skill in the art to which the present invention pertains that the present invention can be embodied in modified forms without departing from the essential features of the present invention. Therefore, the disclosed embodiment shall be understood in a descriptive perspective, not a restrictive perspective. The scope of the present invention is disclosed in the appended claims, not in the above description, and it shall be interpreted that all differences within the equivalent scope are included in the present invention.

What is claimed is:

1. A system for detecting a location of fault in a cable, the system comprising:
   a cable, transmitting a fault current;
   a current transforming unit, connected to the cable and receiving the fault current and detecting an original signal of fault current;
   a detecting unit, detecting a first detail signal and a second detail signal from the original signal of fault current, the first detail signal and second detail signal being detail components in a high frequency band;
   a comparing unit, receiving the first detail signal from the detecting unit, and comparing the first detail signal with a preset reference value and determining a fault in the cable; and
   a signal filtering unit, receiving the first detail signal and the second detail signal from the detecting unit, and generating a first filtering signal and a second filtering signal by use of the first detail signal and the second detail signal and outputting a fault detection signal based on a result of comparing the first detail signal with the second filtering signal,
   wherein the detecting unit detects a first approximation signal and the first detail signal by applying wavelet transform to the original signal of fault current, and detects a second approximation signal and the second detail signal by applying wavelet transform to the first approximation signal.

2. The system of claim 1, wherein the detecting unit detects the second detail signal if the first detail signal exceeds the reference value.

3. The system of claim 1, wherein the filtering unit generates the first filtering signal by multiplying the first detail signal by the second detail signal.

4. The system of claim 1, wherein the signal filtering unit generates the second filtering signal by use of a correlation equation of the first detail signal and the first filtering signal.

5. The system of claim 4, wherein the correlation equation is set to be $$C\_new = C \times \sqrt{\frac{\sum D_1^2}{\sum C^2} \times 2},$$

C_new being a second filtering signal, C being a first filtering signal, D1 being a first detail signal.

6. The system of claim 1, wherein the signal filtering unit outputs the fault detection signal by comparing an absolute value of the second filtering signal with an absolute value of the first detail signal, whereas the fault detection signal is outputted when the absolute value of the second filtering signal is greater than the absolute value of the first detail signal.

7. The system of claim 6, the signal filtering unit removes the second filtering signal when the absolute value of the second filtering signal is smaller than the absolute value of the first detail signal.

8. The system of claim 1, further comprising a computing unit, the computing unit receiving the fault detection signal from the signal filtering unit and computing a distance to the location of fault by using a delay time of the fault detection signal and a transmission speed of the cable.

9. The system of claim 8, further comprising a communication device, the communication device being connected to the signal filtering unit and the computing unit and providing the delay time of the fault detection signal to the computing unit.

10. A system for detecting a location of fault in a cable, the system comprising:
    a cable, transmitting a fault current;
    a current transforming unit, connected to the cable and receiving the fault current and detecting an original signal of fault current;
    a detecting unit, detecting a first detail signal and a second detail signal from the original signal of fault current, the first detail signal and second detail signal being detail components in a high frequency band;
    a comparing unit, receiving the first detail signal from the detecting unit, and comparing the first detail signal with a preset reference value and determining a fault in the cable; and
    a signal filtering unit, receiving the first detail signal and the second detail signal from the detecting unit, and generating a first filtering signal and a second filtering signal by use of the first detail signal and the second detail signal and outputting a fault detection signal based on a result of comparing the first detail signal with the second filtering signal,
    wherein the signal filtering unit generates the second filtering signal by use of a correlation equation of the first detail signal and the first filtering signal.

11. The system of claim 10, wherein the detecting unit detects the second detail signal if the first detail signal exceeds the reference value.

12. The system of claim 10, wherein the filtering unit generates the first filtering signal by multiplying the first detail signal by the second detail signal.

13. The system of claim 10, wherein the correlation equation is set to be $$C\_new = C \times \sqrt{\frac{\sum D_1^2}{\sum C^2} \times 2},$$

C_new being a second filtering signal, C being a first filtering signal, D1 being a first detail signal.

14. The system of claim 10, wherein the signal filtering unit outputs the fault detection signal by comparing an absolute value of the second filtering signal with an absolute value of the first detail signal, whereas the fault detection signal is outputted when the absolute value of the second filtering signal is greater than the absolute value of the first detail signal.

15. The system of claim 14, the signal filtering unit removes the second filtering signal when the absolute value of the second filtering signal is smaller than the absolute value of the first detail signal.

16. The system of claim 10, further comprising a computing unit, the computing unit receiving the fault detection signal from the signal filtering unit and computing a distance to the location of fault by using a delay time of the fault detection signal and a transmission speed of the cable.

17. The system of claim 16, further comprising a communication device, the communication device being connected to the signal filtering unit and the computing unit and providing the delay time of the fault detection signal to the computing unit.

18. A system for detecting a location of fault in a cable, the system comprising:

- a cable, transmitting a fault current;
- a current transforming unit, connected to the cable and receiving the fault current and detecting an original signal of fault current;
- a detecting unit, detecting a first detail signal and a second detail signal from the original signal of fault current, the first detail signal and second detail signal being detail components in a high frequency band;
- a comparing unit, receiving the first detail signal from the detecting unit, and comparing the first detail signal with a preset reference value and determining a fault in the cable; and
- a signal filtering unit, receiving the first detail signal and the second detail signal from the detecting unit, and generating a first filtering signal and a second filtering signal by use of the first detail signal and the second detail signal and outputting a fault detection signal based on a result of comparing the first detail signal with the second filtering signal,
- a computing unit receiving the fault detection signal from the signal filtering unit and computing a distance to the location of fault by using a delay time of the fault detection signal and a transmission speed of the cable, and
- a communication device being connected to the signal filtering unit and the computing unit and providing the delay time of the fault detection signal to the computing unit.

19. The system of claim 18, wherein the detecting unit detects the second detail signal if the first detail signal exceeds the reference value.

20. The system of claim 18, wherein the filtering unit generates the first filtering signal by multiplying the first detail signal by the second detail signal.

* * * * *